(12) United States Patent
Lubachevsky et al.

(10) Patent No.: US 7,257,526 B1
(45) Date of Patent: Aug. 14, 2007

(54) DISCRETE EVENT PARALLEL SIMULATION

(75) Inventors: Boris Dmitrievich Lubachevsky, Bridgewater, NJ (US); Alan Weiss, Millburn, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/543,284

(22) Filed: Apr. 5, 2000

(51) Int. Cl.
   G06G 17/50 (2006.01)
   G06G 17/10 (2006.01)
   G06F 9/46 (2006.01)

(52) U.S. Cl. ............................... 703/17; 703/2

(58) Field of Classification Search ............... 703/17
   See application file for complete search history.

(56) References Cited

U.S. PATENT DOCUMENTS 4,901,260 A * 2/1990 Lubachevsky ............... 703/17
5,375,074 A * 12/1994 Greenberg et al. ............ 703/17

OTHER PUBLICATIONS

Eick-S et al. "Synchronous Relazation for Parallel Simulations with Applications to Circuit-Switched Networks," ACM Transactions on Modeling and Computer Simulations, vol. 3, No. 4 Oct. 1993, pp. 287.*
Lubachevsky et al. "Efficient Distributed Event Driven Simulations of Multiple Loop Networks". ACM PRess 1998.pp. 12-24.*
Lubachevsky et al. "An Analysis of Rollback-Based Simulation". ACM Press. 1991. p. 155-193.*
Fox et al., "Neural Networks and Dynamic Complex Systems" Caltech Concurrent Computation Program p. 129-142 Mar. 1989.*
Backer et al. "Parallel Event-Driven Logic Simulation Algorithms: Tutorial and Comparative Evaluation" IEE 1996 vol. 143, No. 4 Aug. 1996. p. 177-185.*
Luachevsky-B.D., Almost Linear Speed-Up of Distributed Discrete Event Simulations 1988. IEEE, p. 187-190.*
Luachevsky-B.D., "Several Unsolved Problems in Large-Scale Discrete Event Simulations" 1993 ACM p. 60-67.*
Misra-J., "Distributed Discrete-Event Simulation" 1986 ACM p. 39-65.*
Cota et al., "An Algorithm for Parallel Discrete Event Simulation Using Common Memory" 1989 ACM, p. 23-31.*
Lubachevsky,B.D., Bounded Lag Distribution Discrete Event Simulation 1988 Society of Computer Simulation, p. 183-191.*
Stephen G. Eick et al, "Synchronous Relazation for Parallel Simulations with Applications to Circuit-Switched Networks," ACM Transactions on Modeling and Computer Simulations, Vo. 3, No. 4, Oct. 1993, pp. 287-314.

* cited by examiner

Primary Examiner—Anthony Knight
Assistant Examiner—Tom Stevens

(57) ABSTRACT

An efficient parallel event simulation method is implemented by simulating blocks of M edge events, where M is approximately equal to $e \log_e N$, and N being the number of interconnected processing elements. Following a simulation iteration, each processing element shares information with adjacent processing elements that relates to events that the processing elements simulated which may affect the simulation of events at the neighbor processing elements. When the communication reveals that the information that is shared by a neighbor processing elements is different from the information that the processing element assumed, then the arriving information is kept and the simulation process is repeated. In executing the repeated simulations of a block, the same random variable values are employed. When all of the processing elements find that the arriving shared information is the same as the information already known to the receiving processing element, simulation of the block ends. A new simulation floor is ascertained, and another block of event is simulated.

24 Claims, 5 Drawing Sheets

DISCRETE EVENT PARALLEL SIMULATION

BACKGROUND OF THE INVENTION

This invention relates to simulation, and more particularly, to simulation of a system through parallel processes.

The designs of many systems can benefit from simulations. This includes complex systems which include diverse subsystems that comprise both hardware and software modules; as well as what, on the surface, appears to be a single system, such as the design of drug, or a material.

In an article presented by Stephen Eick, Albert Greenberg, and the inventors herein, titled "Synchronous Relaxation for Parallel Simulations with Applications to circuit switched networks," ACM Transactions on Modeling and Computer Simulation, Vol. 3, No. 4, October 1993, pp 287-314 (Eick et al), an efficient, general purpose, synchronous relaxation method is disclosed. The method is applied in the article to simulating the AT&T switched network and is shown to be applicable to single-instruction-multiple-data (SIMD) processing arrangements with a plurality of processing elements (PEs), as well as to multiple-instruction-multiple-data (MIMD) processing arrangements. The simulation proceeds in time-stepped fashion. At the $i^{th}$ (h step, the algorithm simulates all events that fall in the time interval $[(i-1)\Delta, i\Delta]$, where $\Delta$ is a design parameter. If $\Delta$ is very small, the method degenerates to time-driven simulation. Since the simulation is slow when $\Delta$ is very small, it is recommended that $\Delta$ be selected large enough so that each time interval typically has several events to process.

The system to be simulated is divided into subsystems, and each subsystem is assigned to a PE. In dividing a system it generally turns out that at least some of the events of the subsystem are not independent, in the sense that they depend on parameters in subsystems that were assigned to different PEs (foreign parameters). At the beginning of a simulated time interval, each PE knows the initial values of all of the foreign parameters that are involved in the simulation of events in the subsystem. However, while a PE simulates the events in its subsystem, the values of those foreign parameters become uncertain. In spite of this uncertainty, each PE proceeds with its simulations based on the initial values of those foreign parameters. Consequently, it is possible that the events simulated by a PE might contain errors. For that reason, the simulation described by Eick et al is performed iteratively. The first iteration ends with an exchange of information among the PEs regarding the values of the foreign parameters. The newly received values of the foreign parameters are compared to the initial values of the foreign parameters. When there are differences between the parameters at the beginning of the first iteration and at the end of the first iteration, additional assessments are undertaken to determine whether a simulation error may have resulted from the use of the initial values of the foreign parameters. If so, a second iteration is executed.

In a second iteration, the values of the foreign parameters that each PE uses are tempered by the information from the first iteration. When the second iteration completes, another communication round takes place, and the PEs determine what errors remain. At the end of each iteration, a next iteration is initiated when it is determined that errors potentially remain. When no errors remain, it is concluded that the simulation of the time interval $[(i-1)\Delta, i\Delta]$ has been accomplished, and the index i is incremented to trigger the simulation of the next time interval.

SUMMARY

An efficient parallel event simulation method is presented that is implemented on a plurality of interconnected processing elements. The method performs simulations in blocks of M edge events, where M is approximately equal to $e \log_e N$, N being the number of interconnected processing elements. Following each simulation iteration, a communication process takes place where each PE shares information with its adjacent PEs. The information that is shared relates to the events that the PE simulated which may affect the simulation of events at the neighbor PEs. When the communication reveals that the information that is shared by a neighbor PEs is different from the information that the PE assumed, then the arriving shared information is kept but otherwise the simulation process is repeated. In executing the repeated simulation process, the random variable values that were employed in the initial simulation process are employed again, in the same sequence. When all of the PEs find that the arriving shared information is the same as the information already known to the receiving PE, it is concluded that the block of events has been successfully simulated. A new simulation floor is ascertained, and another block of event is simulated. The process repeats for as long as desired.

DETAILED DESCRIPTION

Figure 1:
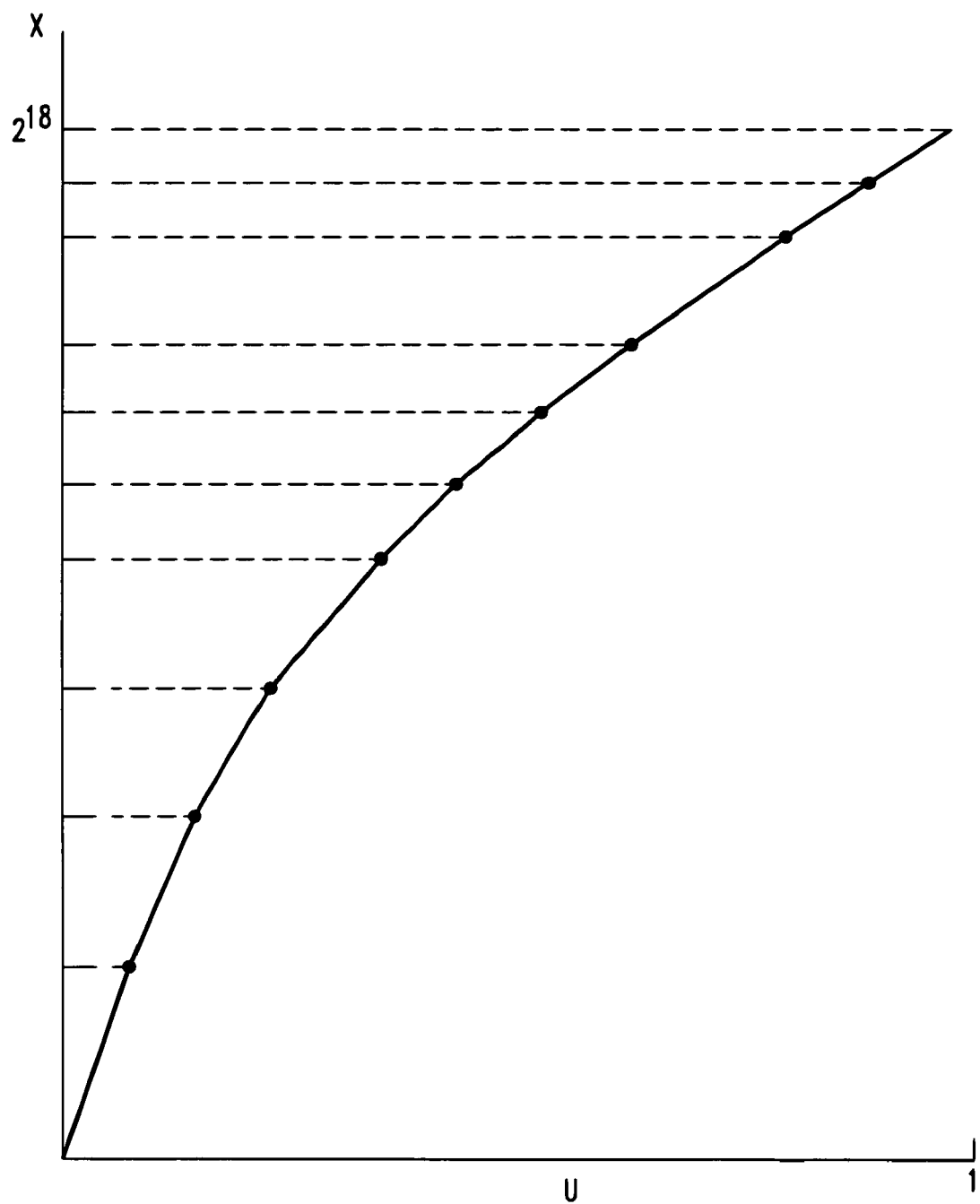
FIG. 1 presents a plot that relates an index of ordered atoms to a random variable, which plot is employed in the parallel event driven simulation method disclosed herein

An illustrative task is described herein to illustrate the simulation principles of this invention. The illustrative task relates to a simulation of the behavior of a particular ferromagnetic material in response to the application of a magnetic field. The application of the magnetic field skews the probabilities of individual atoms flipping from one direction of magnetization to another direction of magnetization. The question to be answered by the simulation is how the individual atoms behave with respect to their magnetization direction, and more particularly, how quickly the macro effects of the applied magnetic field can be observed from the response of the atoms to the applied magnetic field.

A number of observations/assumptions are made in connection with such a simulation task.

1. Although it can be assumed that the magnetic filed is applied to a very small area of the material, the number of atoms in that area (Q) is, still, very large. Therefore, simulating the behavior of such a system is advantageously handled with a parallel simulation algorithm that involves many processing elements (PEs).

2. The behavior of each atom is both a function of the magnetic field and the state (magnetic alignment) of neighboring atoms. For simplicity, we assume that the material surface is one atom thick, and that the atoms are arranged in rows and columns, resulting in each atom having two neighbors on the same row, and two neighbors on the same column.

3. It is convenient to divide the material into subareas, perhaps forming a rectangular array of square subareas, and assigning a PE to each subarea. There are N such PEs, and each such PE is responsible for simulating the atoms in its subarea. Figuratively, therefore, each PE has a neighbor PE to its West, North, East, and South.

4. In simulating the atoms within an assigned subarea, simulation of an event (i.e., a flip in the magnetic orientation) in connection with most of the atoms can be accomplished by the PE without any reference to events simulated by the other PEs. The atoms at the edge of a subarea do not have all of their neighbors in the subarea and, therefore, events in those atoms cannot be simulated with certainty. It can be noted, however, that pursuant to points 2 and 3 above, each edge atom has two or three of its neighbors within its own subarea, and only one or two atoms that are found in an adjacent subarea. Consequently, simulation of an event of an edge atom relies on a state of one or two edge atoms in an adjacent subarea, and since those states are not known with certainty, simulation of the edge atom event may be erroneous. It should also be noted that, even if the state of the atoms in the adjacent subarea are not what they are assumed to be, the simulation of the edge atom event might nevertheless still be correct.

5. It is assumed that only one event takes place at any given instant.

Based on the above, the simulation can proceed by a PE determining a time interval before an atom changes state, identifying an atom that changes state, determining the next time interval, identifying the next atom, etc. This cycle is repeated for as long as desired.

In accordance with one aspect of this invention, the simulation takes place in blocks of a given number of edge atom events (rather than in time intervals Δ as in the Eick et al article). Advantageously, that number, M, is the integer closest to e $\log_e N$, where e is the logarithmic constant whose first 6 digits are 2.71828. That is, each PE simulates M edge atom events in the course of a simulation phase, and then stops in preparation for a communication phase. The communications phase ascertains whether any errors may have crept in because, during the simulation phase, the PE is oblivious to the events that are being simulated by neighboring PEs. As an aside, it should be realized that setting M to some other number does not cause the method disclosed herein to fail. Only its efficiency is affected. Choosing M to be approximately equal to e $\log_e N$ does not materially affect the efficiency of the method.

Carrying out the simulation in terms of blocks of M edge atom events, where M is related to the number of PEs, N, rather than in time intervals of duration Δ results in significantly different simulation details. More importantly, the mathematical characteristics of such an approach are considerably different from those in the Eick et al article and, consequently, the Eick et al article does not lead to a conclusion that such a simulation approach would succeed with equal efficiency. It can be shown, however, that the simulation process disclosed herein does operate quite efficiently, taking on the order of log M iterations to complete.

In the illustrative example presented herein, the time interval (from the last event) when the event occurs is a random variable, and so is the particular atom in which an event occurs. It is related to the energy of the atom, and that energy is related to the state of the atoms' neighbors.

An atom is in one of two states, and each of the atom's four neighbors can be in one of two states. Hence, there are 10 different energy levels that an atom can have. One possible expression of the energy of the atom is $$E = -\sum_{i=1}^{4} s_0 s_i - s_0 H \qquad (1)$$

where $s_0$ is the state of the atom (+1 or −1), $s_i$ is the state of the neighbor i atom, and H is the applied magnetic field. The rate at which the atom will flip its magnetic orientation, r, is related to its current energy level and to the energy level that it would have if it were to flip; e.g., $$r = \exp\left(-\frac{E_{flipped} - E}{kT}\right) \qquad (2)$$

where $E_{flipped}$ is the energy the atom would assume when it flips its magnetic orientation. The rate, r, is the rate of a Poisson process. The time that the atom will flip, t, is related to the rate; e.g., $$t = -\frac{1}{r}\log_e u \qquad (3)$$

where u is a uniformly distributed random variable such that 0<u<1.

Because the energy of each of the atoms can be in one of 10 states, the entire set of atoms can be grouped into 10 sets, and since Poisson distributions can be added, the total rate (the rate at which some atom will flip) is $$r_{total} = \sum_{j=1}^{10} r_j n_j \qquad (4)$$

where $r_j$ is the rate of group i, and $n_j$ is the number of atoms in group i. In each group i, an event will occur (i.e., some atom will flip) at a group rate $gr_i$ $$gr_i = r_i n_i. \qquad (5)$$

The particular atom that changes state can be selected by using the same uniformly distributed random number that is used to determine the time interval for the occurrence of an event (or a different random number). Identity of an atom in correspondence to the obtained random number must take into account the states of the atoms in the subarea.

One way to accomplish this, at least conceptually, is with a function y=f(u), where the abscissa, u, corresponds to the random variable, ranging from 0 to 1, and the ordinate, y, specifies the atom where the event occurs (ranging from 1 to the number of atoms in a subareas). The function $f(u)$ is a piece-wise linear curve as depicted in FIG. 1, where the groups are sorted by rate, from the lowest group rate to the highest group rate ($gr_1>gr_2>K>gr_{10}$), the group with the lowest rate is selected first, all of the atoms in the selected group are laid out adjacent to each other along the y-axis, and subsequent groups are similarly laid out along the y-axis. When the number of atoms in a subarea is Q, the abscissa can be divided into Q discrete values between 0 and 1, and thereby each discrete value of u corresponds to a particular atom along the ordinate. Assigning consecutive index values to the atoms along the y-axis results is each atom having an associated index and an associated value of u. This allows the FIG. 1 curve to be defined very efficiently with a simple 10 entry table, with each entry having three fields: $y^i$, $u^i$, and $r_{total}/gr_i$. The $y^i$ entry corresponds to the index of the last atom in group i, $u^i$ is the value along the abscissa for that last atom, and $r_{total}/gr_i$ is the slope of the FIG. 1 piecewise linear curve in the region of group i. Given such a table, an index of an atom can be computed for any value of u $$y = \frac{r_{total}}{gr_i}(u - u^{i-1}) + y^{i-1} \qquad (6)$$

where i is the group number and is such that $u^{i-1} \leq u < u^i$, $y^{i-1}$ is the index value of the last atom in group i−1, and y is the index value of the identified atom.

Thus, given a selected value for the uniformly distributed random variable u, the time interval t is determined in accordance with equation (3), and the atom is selected by identifying its index with equation (6). Specifically, the selected value of u is first employed to identify the group, and once the group is identified, equation (6) is brought to bear to compute the index, y, of the identified atom.

To implement the above in hardware, it is advantageous to have two arrays for the atoms of a subarea. In the first array (array A), the atoms are stored based on their location in the subarea. This simplifies (and, hence, speeds up) finding neighbors of a given atom. The information stored in array A contains at least a pointer to the second array. It also contains information that is needed about the atom, such as its magnetization direction. The second array (array B) is grouped according to the indices in the above-described rate curve. Array B contains a reference to the indexed atom, which may be simply a pointer to the atom's address in array A. This memory can be in a separate physical memory of a PE or, more likely, in a separate portion of the memory of a PE.

Figure 2:
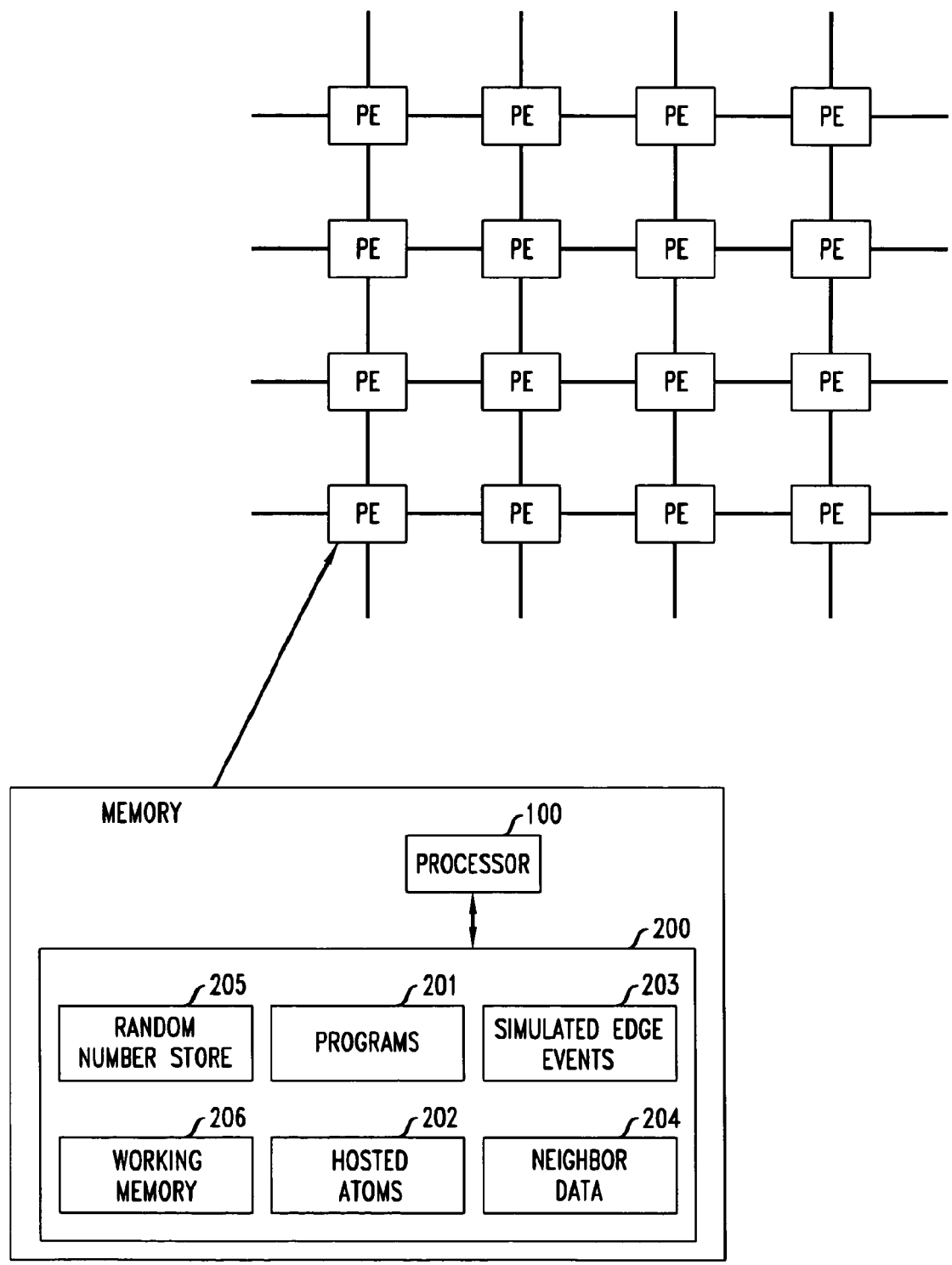
FIG. 2 presents a diagram of the hardware arrangement employed in the parallel event driven simulation method disclosed herein.

At this point it may be useful to describe the hardware configuration. The configuration is shown in FIG. 2, where a number of identical PEs are arranged in a rectangular array, with each PE connected, for communication purposes, to four neighbors. The interconnected PEs are also connected to a single controller PE, but for sake of clarity neither the controller PE is shown, nor the connections to the controller PE. FIG. 2 does present a block diagram of one PE in the collection. The shown PE block diagram includes a processor 100, and a memory 200 that can be divided into a number of logically distinct memories:

program memory 201;
memory 205 that keeps record of the values of the random variable, u, that are used in the simulation;
working memory 206;
memory 204 that keeps incoming information from the four neighbors,
memory 203 that keeps information to be communicated to neighboring PEs; and
memory 202 that keeps arrays A and B, described above. There is a time that is associated with the information in arrays A and B in memory 202, and that is the current simulation floor time.

Figure 3:
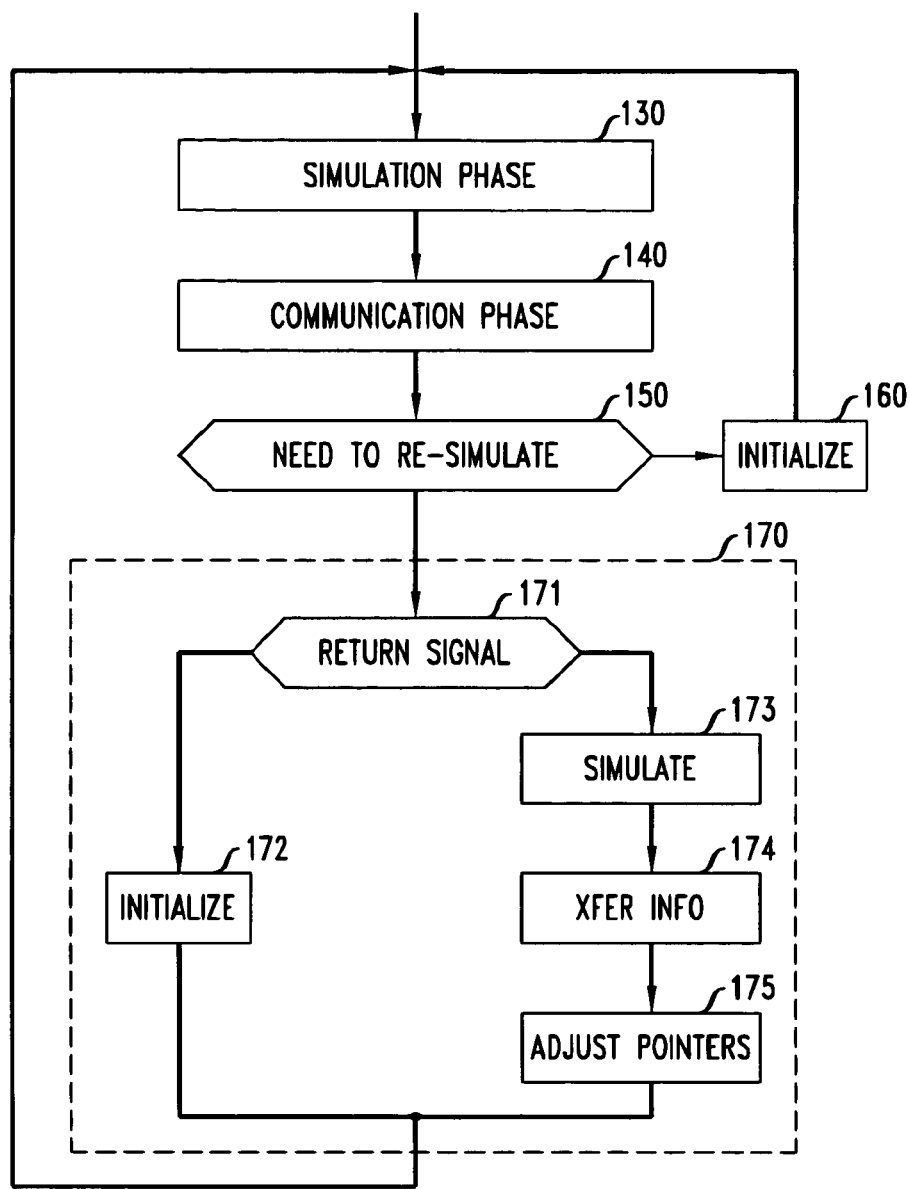
FIG. 3 presents a general flow diagram that shows the simulation phase, the communication phase, and the initialization steps of the method disclosed herein.

FIG. 3 presents a very general flow diagram of the process disclosed herein, where the simulation is carried out in blocks of M edge events. Specifically, events are simulated in simulation phase 130, one at a time, until M edge events are simulated. An edge event is a simulation of a change in the magnetization state of an edge atom. It is expected that the number of events that are simulated in a block (edge events and non-edge events) will be significantly larger than M. Following simulation phase 130, communication is undertaken with adjacent PEs in communication phase 140. Based on information gained from such communication, the following step 150 may determine that another iteration of the simulation step is required. In such an event, control passes to step 160, which reinitializes information in memories of the PE and returns to step 130. Otherwise control passes to step 170, where a new simulation floor is identified, information in the memories of the PE is appropriately initialized, and control also returns to step 130.

Figure 4:
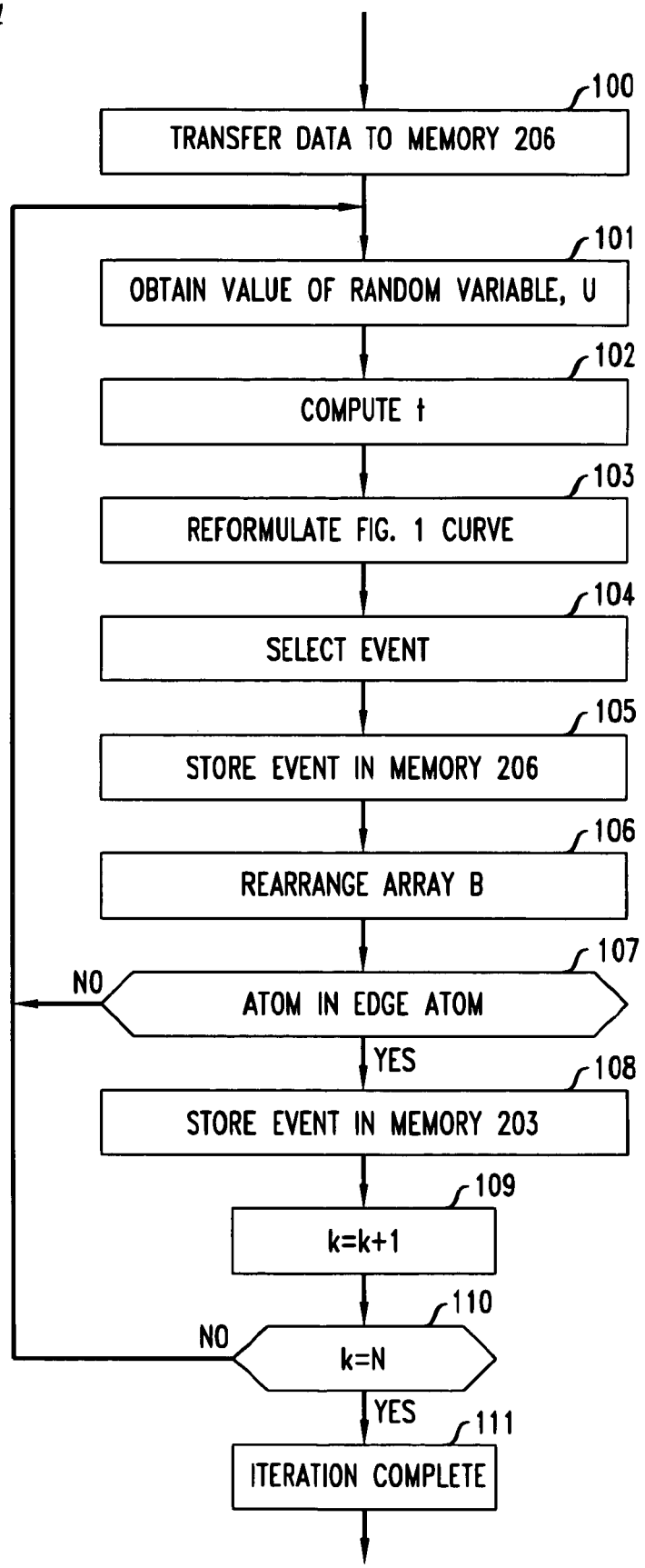
FIG. 4 presents a more detailed flow diagram of the simulation phase.

The actual simulation process (130) is executed with the aid of working memory 206 in accordance with the flow diagram presented in FIG. 4. However, before FIG. 4 is addressed, it is important to address the values of the random variable, u, and how the information in array B is manipulated.

Figure 5:
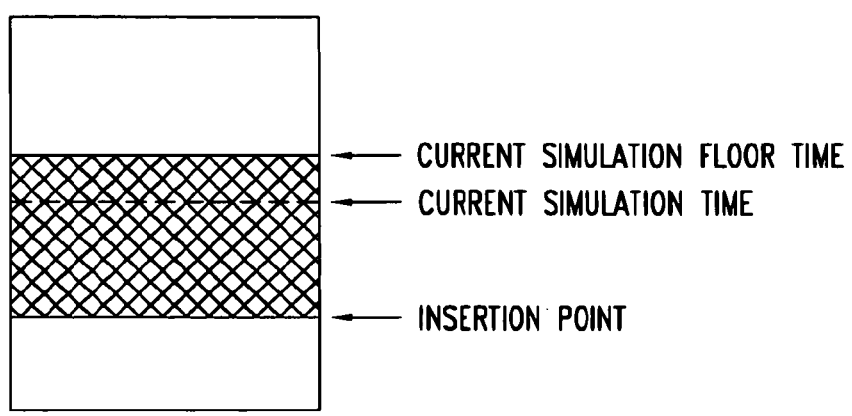
FIG. 5 presents a image of a memory for storing the random variable employed in connection with an array that embodies the FIG. 1 plot.

With respect to the variable, u, we have determined that, in order to ensure the expected mathematical behavior of the simulation, certain restrictions on the values of u should be imposed. Specifically, in the course of a first simulation iteration, starting from a particular simulation floor, the values of u should be taken from a random number generator having a uniform distribution. In all subsequent simulation iterations that start from the same simulation floor time, the very same values of u should be employed. To provide for this capability, each PE has a memory (i.e., memory 210), which stores values of variable u that are employed once and that might be employed again. FIG. 5 depicts one organization of memory 210, where the memory is treated as a circular memory, in the sense that the first address in the memory follows the last address in the memory. As shown, the generated values of the random variable u are kept in the crosshatched area, between a memory address that corresponds to the "current simulation floor time", and the address where the last random variable u value was inserted in the memory. The actual simulated time (particularly in the course of an iteration other than the first iteration) may be at a simulated time that is anywhere between the current simulation floor time and the insertion point, which follows the address where the last random variable u value was inserted. Accordingly, in the FIG. 5 embodiment, there is a "current simulation floor time" pointer that points to some address in memory 210, and there is a "current simulated time" pointer. The "current simulated time" pointer points to the simulated time and, at first, it points to the address in memory 210 the follows immediately the address pointed to by the "current simulation floor time" pointer.

When a value of u is needed by the simulation process of FIG. 4, memory 210 is consulted for the content of the memory address pointed to by the "current simulated time" pointer. Whatever information is stored in memory 210 at that address is used as the value of u, unless it is 0. If that value is 0, a random number generator is accessed, the value derived from such number generator is stored in the empty memory location, and that value is employed in the FIG. 4 process. In either case, the "current simulated time" pointer is advanced one step.

When a subsequent iteration is started based on the same simulation time floor, the "current simulated time" pointer is again made to point to the address following the "current simulation floor time" pointer, but this time the address contains a value other than 0. That value is used for the value of u, as described above.

When step 150 concludes that no additional simulations are necessary (from the current simulation floor time), step 170 (among other things) advances the "current simulation floor time" pointer of memory 210 to the new simulation floor time, and erases all of the u values between the old simulation floor time and the new simulation floor time.

In an alternative embodiment, when step 150 concludes that no additional simulations are necessary all of the values of u beyond the "current simulation floor time" pointer of memory 210 are erased by step 170. In such an embodiment, the "current simulation floor time" pointer can be permanently set at some address of memory 210, for example the address 0.

As an aside, to access a random number generator, all that is required is to have a random number generator function in processor 100, which is fairly conventional.

With respect to the information in array B, the array is arranged with all atoms in a certain group being indexed adjacently. When a simulation of an atom occurs, which means that an atom changes state, the energy of that atom changes and, correspondingly, the group to which the atom belongs in array B changes. Moreover, the energy of the four neighbor atoms changes as well. Accordingly, each simulated atom causes a movement of five atoms in array B from one group to another group. Further, since an energy change induces a charge in the atom's rate (as well as a change in a rate group designation), the $r_{total}$ changes, as well as the group rate of each group of the groups that gained an atom or that lost an atom change. Hence, all of the slopes in the FIG. 1 piecewise linear curve change value.

Moving an atom from one rate group to another rate group that is the target rate group (for example, a higher one) can be accomplished by removing the atom that needs to be moved up out of array B (creating a void), shifting all higher atoms down, up to the higher target group, thereby creating an empty location at the bottom of the target group, and inserting the removed atom into that empty location. Since the number of atoms in a group can be quite large, the shifting operation would be time consuming.

Alternatively, a swapping process can be executed as follows, given a demarcations table as described above, and given the identity of the atom in array A of memory 206 which needs to be moved in array B, say $A_x$, do the following:

1. Retrieve the index, $y_x$, of $A_x$ from array A of memory 206. That provides a pointer to array B.
2. Identify the group, q, to which $y_x$ belongs, where q is such that $y^{q-1} < y_x \leq y^q$ (obtained from the demarcations table).
3. Identify the atom in array A of memory 206 whose index is $y^q$ (say it's $A_p$)
4. In array B, swap the atom at $y_x$ with the atom at $y^q$, and modify index within array A of memory 206 for the atom identified in step 3, to point to the index $y_x$. That is, in array B location $y_x$, insert $A_p$; in array B location $y^q$ insert $A_x$. In array A in location $A_p$ in array A insert $y_x$.
5. Decrement $y^q$ by 1 in the demarcation table, effectively placing the atom that was at $y_x$ at the bottom of group q+1.
6. If the rate group q+1 is the target rate group, change the index in array A of memory 206 for the atom to be moved, i.e., $A_x$, to point to $y^q$, and stop. Otherwise, change the value of the index of the atom to be swapped to be $y^q$ and change the value of q to be equal to the value of q incremented by 1. Return to step 3.

To illustrate, assume that the demarcations table specifies that the group demarcations are at indices 30,000, 60,000, 90,000, 120,000, 150,000, 180,000, 210,000, 240,000, 270, 000, and 300,000. Assume further that an atom located in position 100,200 in array A points to location 70,000, and that it is desired to move that atom to rate group 5. In step 1 it is determined that the atom in question has the index 70,000, and in step 2 it is determined that the atom at index 70,000 is in group 3 (between 60,000 and 90,000). Per step 3, array B is accessed and thus it is ascertained that the atom whose index is 90,000 is, for example, the atom in position 33, 124 in array A. In step 4, the atom at index 90,000 is moved to location 70,000 and the index of the in position 33, 124 in array A of memory 206 is changed from 90,000 to 70,000. Executing step 5 changes the demarcations table entry of 90,000 to 89,999, thereby placing the moved atom in group 4. Step 6 sets the value of q to 4, and set the target atom to be swapped to be the atom with index 120,000. Returning to step 3, array B is consulted, and the identify of the atom whose index is 120,000 is ascertained; say atom at position 200,000. Repeating step 4, the atom at location 120,000 of array B is swapped with the atom at location 89,999 and the index in array A of the atom at position 200,000 is changed to point to location 89,999. Repeating step 5 changes the demarcations table entry of 120,000 to 119,999, thereby placing the atom that was moved to location 120,000 within group 5. Since this is the target group, the index in array A of the atom that was placed in location 120,000 (i.e., the atom at position 100,200) is modified to point to location 120,000, and the process terminates.

The process terminates, that is, with respect to moving an atom in question to the proper rate group and assigning to it a proper index. The next step is to recompute the two affected group rates (that one that lost an atom and the one that gained an atom), to recompute $r_{total}$, to recompute the slopes, and to update the demarcations table.

Addressing now the flowchart of FIG. 4, a simulation process of phase 130 begins with step 100, where an image of array A and an image of array B is copied from memory 202 into working memory 206. Memory 203, which is the memory that holds information that the PE wishes to eventually communicate to its neighbor PEs, is also updated with the appropriate information from array A of memory 202. Memory 204 maintains a record of the last known state of all edge atoms of neighbor PEs that are relevant to the PE. That is, it includes the western edge atoms of the PE to the East, the eastern edge atoms of the PE to the west, the southern edge atoms of the PE to the North, the northern edge atoms of the PE to the South. Each record in memory 204 contains the identity of the atom (i.e. its position in array A of its PE), and the time it was last simulated. The contents of memory 205 are irrelevant at this point.

It is assumed that, initially, in the indexing of atoms array B account has been taken of the contents of memory 204.

Following step 100, step 101 obtains a value for the random variable u, as described above. Control then passes to step 102 where a time interval is obtained through equation (3), which effectively specifies the simulated time at which the next event occurs. Control then passes to step 103 where the state of array B in memory 206 is considered in light of the information in memory 204. At a first simulation iteration, the information in array B within memory 202 has taken account of the information in memory 204 (as indicated above), but is subsequent iterations, that will not be the case. Given the interval that was computed in step 102 and a next simulated time is thus obtained, step 103 identifies each atom in memory 204 that changed state between the last simulated time and the new simulated time (i.e. that changed state during the computed time interval) and accounts for the effect of each such atom on the atoms in array B of memory 206.

Specifically, each changed atom in memory 204 changes the energy level of an atom in array A of memory 206, and that triggers a need to change array B and the contents of the demarcations table. That is achieved as described above.

Once step 103 completes its function, control passes to step 104, which identifies the atom that changes state based on the value of the random variable, u, the modified array B in memory 206 and the modified demarcations table. This is implemented, as described above, by identifying the rate group, i, such that $u^{i-1} \leq u < u^i$, and proceeding in accordance with equation (6). Following step 104, step 105 stores the fact that the atom identified in step 104 has changed state in array A of memory 206, and passes control to step 106. Step 106 modifies array B and the demarcations table as described above. Thereafter, decision block 107 determines whether the atom that just changed state is an edge atom. If it is not, control returns to step 101. Otherwise, control passes to step 108, which stores the identity of the edge atom, and the simulated time at which it changed state, in memory 203. Control then passes to step 109, where an index k is incremented. Index k is then compared in step 110 to M, which is the number of edge events that define a block of events to be simulated. When k<M, control returns to step 101 to continue the simulation phase. When k=M, the first iteration of the simulation phase completes, and control passes to step 111, which informs the controller PE of the fact that the PE completed a simulation phase iteration (i.e. phase 130 is complete) and provides the controller PE with the simulated time of the last event to be simulated, which is the $M^{th}$ edge event. At this point, arrays A and B in memory 206 have updated information that reflects the simulation of a set of events that includes M edge events. Memory 203 contains updated information about the state of edge atoms, and includes simulation time information. This is information that neighboring PEs need. Memory 204 contains information about edge atoms of other PEs. This information was valid at the beginning of the simulation phase iteration, but it may be incorrect now.

Having completed a simulation phase 130 iteration, the next step is a communication phase 140. Each PE transmits the appropriate contents of its memory 203 to its neighbor PEs, and receives from its neighbor PEs corresponding information. The received information is stored in memory 205.

As indicated above, the determination is made in step 150 as to whether another iteration of the simulation phase is required. This is accomplished simply by comparing the contents of memory 204 to the contents of memory 205. When the contents match, there is no need for another iteration. In such an event, step 150 sends a "no error" signal to the controller PE and, as indicated above, passes control to step 170. Otherwise, there another iteration is required. When another iteration is required, step 150 sends a "new iteration" signal to the controller PE and, as indicated above, passes control to initialization step 160. Step, transfers the contents of memory 205 to memory 204, again implanted an image of arrays A and B in memory 202 in memory 206, rests the "current simulated time" pointer of memory 205 to the address just following the "current simulation floor time" pointer, and, as indicated above, returns control to step 130.

Following the transmission of a "no error" signal or a "new iteration" signal to the controller PE, control passes to step 171 where a responsive signal from the controller PE is evaluated. When the responsive signal corresponds to a "repeat simulation phase" signal, control passes to step 172 that performs the identical function of step 160 and, thereafter, control returns to step 130. When the responsive signal corresponds to a "new simulation floor" signal, control passes to step 173. The new simulation floor signal from the controller PE include a new current simulation floor time, which corresponds to the PE (from among the N PEs) with the lowest time when the $M^{th}$ edge even was simulated. This time is easily determined by the controller PE from the information that each PE sends to the controller PE.

Figure 6:
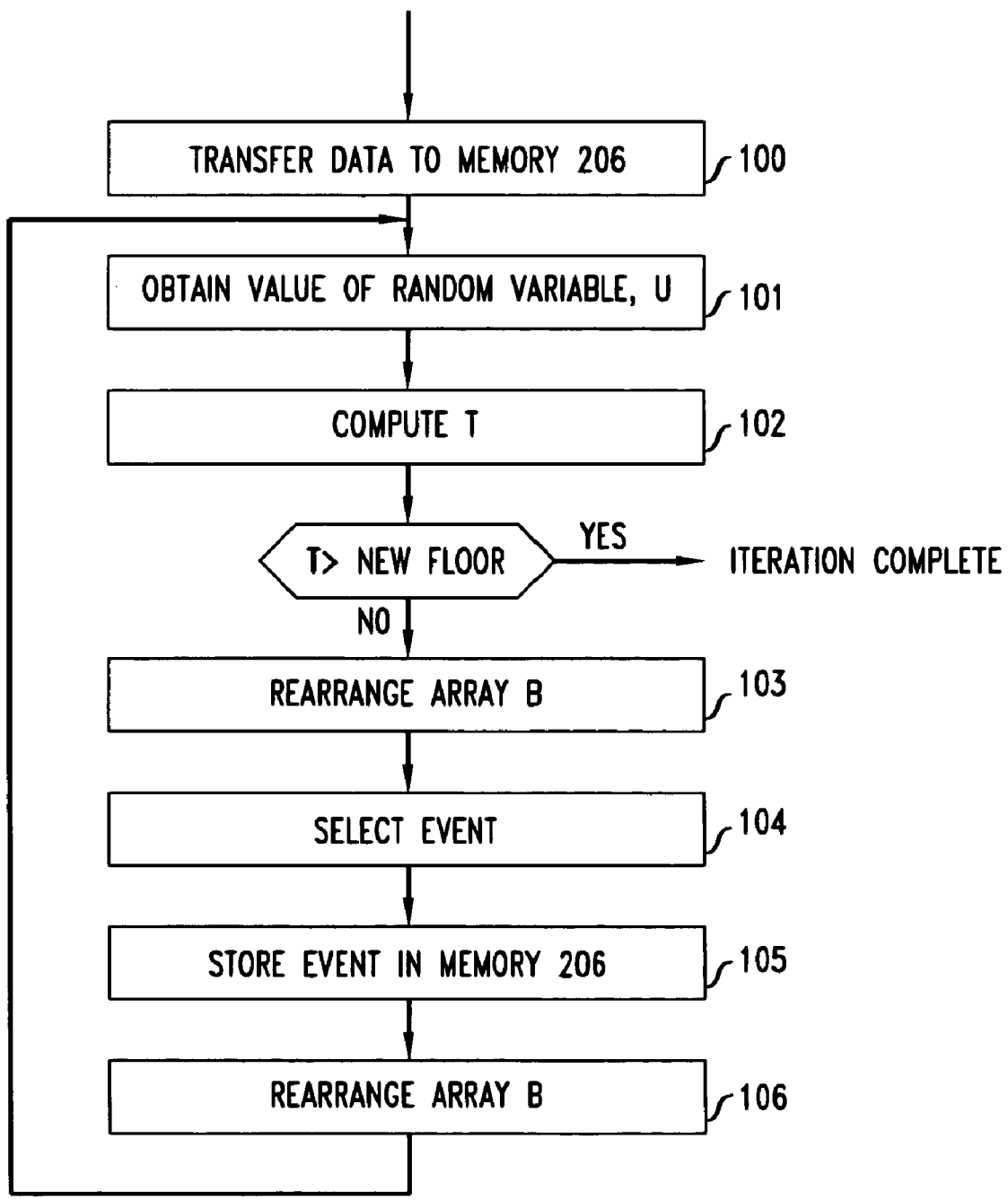
FIG. 6 is a detailed flow diagram of the final simulation phase, just prior to the movement of the simulation floor time.

Step 173 re-initializes in the manner of step 160 and performs a final simulation iteration in accordance with FIG. 6. All steps in FIG. 6 that have the same designation as in FIG. 4 perform the same function, and a perusal of the FIG. 6 flowchart reveals that the process is effectively identical to the FIG. 4 process, except that, in FIG. 6, the simulation based on the simulated time, and not based on the number of edge events simulated. Once the simulation process of step 173 is completed, control passes to step 174, which transfers the information in arrays A and B in memory 206 to arrays A and B in memory 202, respectively. Finally, control passes to step 175, which adjusts the pointers in memory 210. The new "current simulation floor time" pointer is set to the address of the last-fetched value of u, and the "current simulated time" pointer is set to the immediately following address. All described above, all values of u between the last "current simulation floor time" pointer and the new "current simulation floor time" pointer are erased from memory 210.

We claim:

1. A method executed in hardware for simulating events in a physical system comprising the steps of:
   a) employing hardware that comprises N processing elements (PEs) that can communicate with each other;
   b) subdividing said physical system into N subsystems and assigning a different subsystem of said subsystems to each of said N PEs;
   c) in a simulation step, each of said PEs concurrently simulating a respective block of events that occur in each respectively assigned subsystem, where said block includes M edge events, where M is approximately e $\log_e N$, e is approximately 2.71828, and an edge event is an event whose simulation in a processing element is directly affected by information originating in another processing element;
   repeating step c) a chosen number of times; and
   outputting results of said simulations from each of said N PEs.

2. The method of claim 1 where said simulation step comprises one or more iterations.

3. The method of claim 2 where each of said iterations comprises a simulation phase followed by a communication phase and an assessment phase.

4. The method of claim 3 where, in each communication phase, each of said PEs shares information with one or more other PBs from said N PBs, which information is needed by said other PEs to simulate edge events of said other PEs.

5. The method of claim 4 where said information shared by each PE in a communication phase of an iteration is related to events simulated by said each PE in said iteration.

6. The method of claim 4 where said assessment phase carried out by each of said PEs comprises the steps of
determining whether a simulation error can be excluded, and
directing that another simulation iteration is to take place when the existence of a simulation error cannot be excluded.

7. The method of claim 6 further comprising a floor advancement step that is carried out in each of said PEs when said step of determining in said assessment phase concludes that there are no simulation errors in a simulation iteration, where the advancement step advances a simulation floor time of a present simulation step to form a modified simulation time floor, for simulating another block of M events in a next simulation step.

8. The method of claim 6 further comprising a step of advancing a simulation floor time from a simulation floor time of a present simulation step, to form a modified simulation floor time, for starting from said modified simulation floor time the simulation of another block of M events in a next simulation step, when said step of determining in said assessment phase concludes that there are no simulation errors in said present simulation step.

9. The method of claim 8 where said modified simulation floor time corresponds to an earliest simulation time of the $M^{th}$ edge event simulated by said N PEs in said present simulation step.

10. The method of claim 4 where events are simulated seriatim in each simulation phase.

11. The method of claim 10 where for simulating a second event following a simulation of a first event,
a time interval is identified between a simulation time of said first event and a simulation time of said second event, and
said second event is identified for simulation.

12. The method of claim 11 where said second event is identified for simulation following a step of accounting for simulation of said first event and simulation of events in said other PEs from said N PEs.

13. The method of claim 12 where said accounting is based on present knowledge of states of said other events.

14. The method of claim 12 where said accounting for simulation of events in said other PEs from said N PEs accounts for events simulated during said time interval.

15. The method of claim 11 where said second event is identified by employing a first random number.

16. The method of claim 11 where said time interval is identified with a second random number.

17. The method of claim 16 where said second random number is set to said first random number.

18. The method of claim 15 where said first random number is derived from a random variable having a uniform distribution.

19. The method of claim 15 where the seriatim simulation of each event in said block of M events, in a first iteration starting from a given simulation floor time, employs an independently derived random number from said random variable, forming thereby a sequence of random numbers, and simulation of said block of M events in all subsequent iterations starting from said given simulation floor time employs said sequence of random numbers.

20. The method of claim 18 where the sequence of random numbers employed in one simulation step is different from a sequence of random numbers employed in another simulation step.

21. Apparatus that includes N interacting processing elements (PEs), the improvement characterized by:
each of said N PEs storing a specification of a subsystem of a system composed of interacting subsystems; and
said N PEs (a) executing a selected number of simulation steps, and in each simulation step each of said PE's simulates a block of operational events of its associated subsystem, where a block contains M edge events, where M is approximately equal to log N, and an edge event is an event whose simulation in a processing element is directly affected by information originating in another processing element, and (b) outputting results of the simulations.

22. A storage element that is adapted to interact with a processing element comprising:
a first software module that, when executed in a processor, simulates operational events of a stored subsystem that is part of a system of interacting subsystems, primarily in blocks that contain M edge events, in addition to non-edge events, where M is approximately equal to log N, and an edge event is an event whose simulation in a processing element is directly affected by information originating from simulations by another module that is substantially the same as said first module, which other module is executed in another processor; and
a second software module that outputs simulated operational events resulting from execution of said first module.

23. The storage element of claim 22 further comprising a third module that communicates with said other module.

24. The storage element of claim 23 further comprising a fourth module that assesses whether, based on information received by said third module, any of said M edge events need to be re-simulated.

* * * * *